(12) United States Patent
Chen et al.

(10) Patent No.: US 12,372,886 B2
(45) Date of Patent: **\*Jul. 29, 2025**

(54) ACOUSTIC PARTICLE DEFLECTION IN LITHOGRAPHY TOOL

(71) Applicant: Taiwan Semiconductor Manufacturing Company LTD, Hsinchu (TW)

(72) Inventors: Tai-Yu Chen, Hsinchu (TW); Sheng-Kang Yu, Hsinchu (TW); Kai Tak Lam, Hsinchu (TW); Sagar Deepak Khivsara, Hsinchu (TW); Shang-Chieh Chien, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 55 days.

This patent is subject to a terminal disclaimer.

(21) Appl. No.: 18/231,909

(22) Filed: Aug. 9, 2023

(65) Prior Publication Data

US 2023/0384696 A1 Nov. 30, 2023

Related U.S. Application Data

(63) Continuation of application No. 17/722,909, filed on Apr. 18, 2022, now Pat. No. 11,822,259.

(51) Int. Cl.
*G03F 7/20* (2006.01)
*G03F 7/00* (2006.01)

(52) U.S. Cl.
CPC ...... *G03F 7/70916* (2013.01); *G03F 7/70033* (2013.01); *G03F 7/70516* (2013.01)

(58) Field of Classification Search
CPC ............ G03F 7/70916; G03F 7/70033; G03F 7/70516; H05G 2/005; H05G 2/008
See application file for complete search history.

(56) References Cited

U.S. PATENT DOCUMENTS

2011/0273691 A1\* 11/2011 Buurman ............... H05G 2/008
355/77

\* cited by examiner

*Primary Examiner* — Mesfin T Asfaw
(74) *Attorney, Agent, or Firm* — Lippes Mathias LLP

(57) ABSTRACT

A method of extreme ultraviolet lithography includes: generating within a source vessel extreme ultraviolet (EUV) light by striking a stream of droplets of target material shot across the source vessel with pulses from a laser to create a plasma from which EUV light is emitted; directing the generated EUV light out of the source vessel through an intermediate focus cap along a pathway toward a reticle of a scanner; creating a longitudinal mechanical wave extending across the pathway; and exposing a photoresist layer on a semiconductor substrate to pattern a circuit layout by the generated EUV light.

20 Claims, 14 Drawing Sheets

Figure 1:
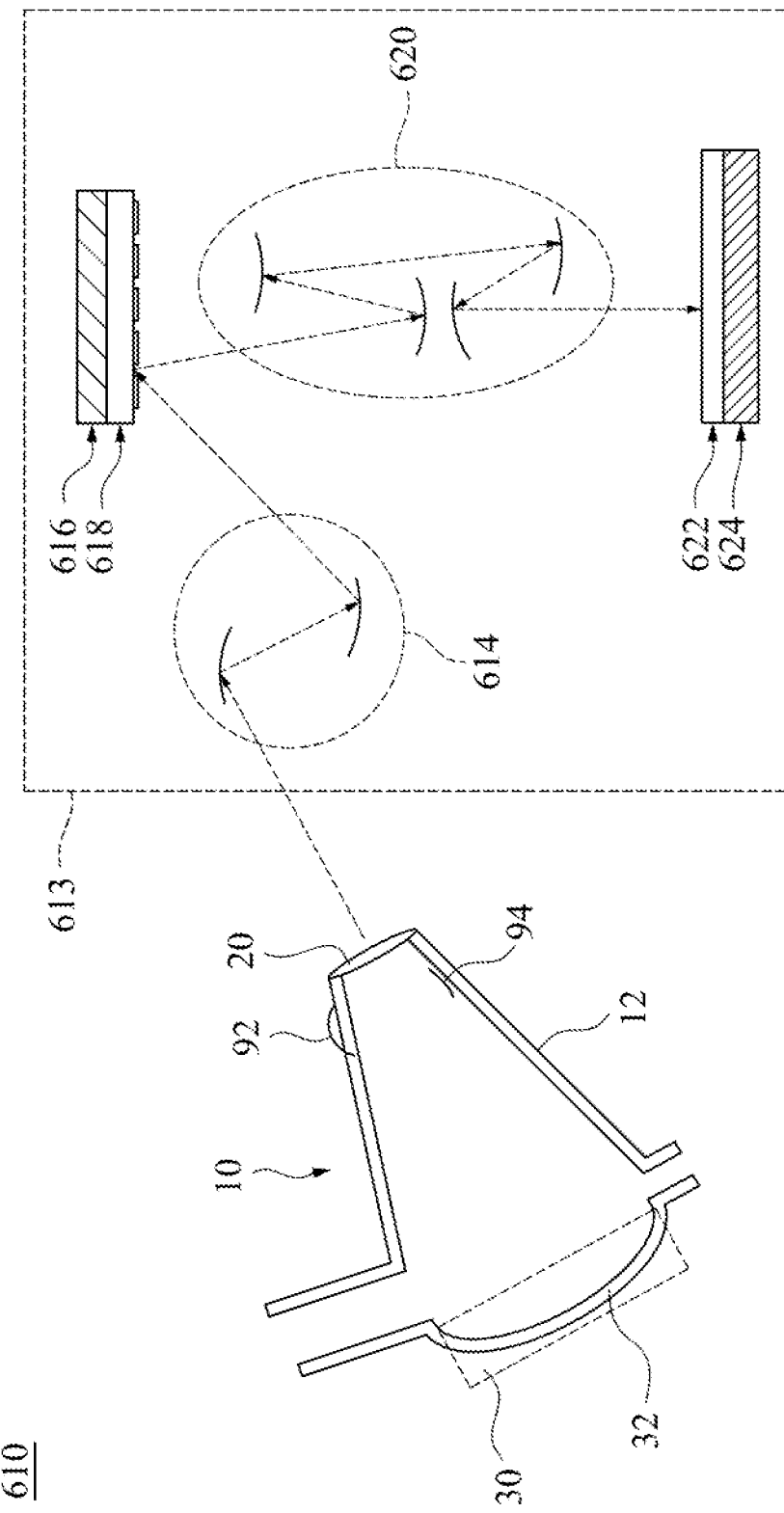

ACOUSTIC PARTICLE DEFLECTION IN LITHOGRAPHY TOOL

PRIORITY CLAIM AND CROSS-REFERENCE

This application is a continuation of U.S. patent application Ser. No. 17/722,909, filed Apr. 18, 2022, the disclosure of which is incorporated by reference herein in its entirety.

BACKGROUND

The following relates to the art of photolithography and/or the like used in the production of semiconductor devices. It finds particular application in extreme ultraviolet (EUV) lithography and is described herein with reference thereto. However, it is to be appreciated that it is likewise suitable for use in connection with other like applications. More specifically, it relates to an acoustic and/or other like particle deflection method and/or lithography tool employing the same.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

FIG. 1 diagrammatically illustrates a lithography system usable in accordance with some embodiments disclosed herein.

FIG. 2 diagrammatically illustrates some further detail of an EUV light source usable in accordance with some embodiments disclosed herein.

FIG. 3 is a diagrammatic illustration showing still some further detail of an EUV light source in accordance with some embodiments disclosed herein.

FIG. 4 is a diagrammatic illustration showing an exemplary acoustic deflection system employed in accordance with some embodiments disclosed herein.

FIG. 5 is a diagrammatic illustration showing another exemplary acoustic deflection system employed in accordance with some embodiments disclosed herein.

FIG. 6 is a diagrammatic illustration showing another exemplary acoustic deflection system employed in accordance with some embodiments disclosed herein.

FIG. 7 is a diagrammatic illustration showing another exemplary acoustic deflection system employed in accordance with some embodiments disclosed herein.

FIG. 8 is a diagrammatic illustration showing another exemplary acoustic deflection system employed in accordance with some embodiments disclosed herein.

FIG. 9 is a diagrammatic illustration showing another exemplary acoustic deflection system employed in accordance with some embodiments disclosed herein.

FIG. 10 is a diagrammatic illustration showing another exemplary acoustic deflection system employed in accordance with some embodiments disclosed herein.

FIG. 11 is a diagrammatic illustration showing another exemplary acoustic deflection system employed in accordance with some embodiments disclosed herein.

FIG. 12 is a diagrammatic illustration showing another exemplary acoustic deflection system employed in accordance with some embodiments disclosed herein.

FIG. 13 is a diagrammatic illustration showing a graphical representation of an acoustic deflection system employed in accordance with some embodiments disclosed herein FIG. 14 is a flow chart showing a method of EUV lithography in accordance with some embodiments disclosed herein.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor device manufacturing, EUV lithography plays a significant role, for example, in minimizing integrated circuits near or below the 5 nm node stage. Generally, the generation of EUV light and/or radiation used in EUV photolithography relies on a laser produced plasma (LPP) mechanism or the like, for example, employing a tin (Sn) or other like target material. To satisfy the desire of higher power and wafer throughput, relatively high power (for example, greater than about 350 W) EUV light sources may be employed. In practice, the EUV light and/or radiation generated via the LPP mechanism is directed toward and/or otherwise illuminates a photolithography mask, also known as a reticle, for example installed within a scanner or scanner system. However, in connection with the LPP mechanism, debris and/or other like particles of Sn or other target material, for example, generated in connection with the production of the plasma, can likewise tend to be directed toward, strike and/or land on the mask or reticle surface, thereby potentially damaging the mask and/or otherwise interfering with the proper or desired functioning of the mask or reticle. This is generally referred to herein as a fall-on reticle defect.

In some embodiments, an EUV light source tool can include, without limitation: a cone shaped chamber (also called a source vessel); one or more high powered lasers (for example, a pre-pulse laser and a main-pulse laser or a single laser that produces both pre-pulses and main-pulses); a droplet generator (DG) that propels droplet of the target material across the source vessel; a collector or collector mirror (for example, a multi-layer coated elliptical mirror) that collects and/or focuses the produced EUV light; and a number of metrology cameras. Suitably, EUV light is generated at a wavelength of about 13.5 nm with an about 1% to about 2% full width at half maximum (FWHM) bandwidth.

In some embodiments, highly repetitive liquid droplets of a target material (for example, Sn) are continuously generated from the DG. At relatively high speeds (for example, around about 80-100 m/s at a frequency of 50 kHz in some nonlimiting illustrative embodiments), the Sn droplets or other suitable target material are shot across the source vessel or chamber near a primary focus region of the collector. Suitably, in a pre-treatment step, the pre-pulse laser is focused on the Sn droplet. When the Sn droplet absorbs the laser energy from the pre-pulse laser, thermal ablation makes the Sn droplet more fluid and it tends to take on a pancake shape, and some ions and tin vapor may also be produced. Subsequently, when the Sn pancake arrives at or near the primary focus (PF) of the collector, the main-pulse laser with highly intense power focuses on the Sn pancake. The thermal energy from the main-pulse laser induces the Sn pancake to generate an abundance of fragments, vapor (for example, neutral atoms and/or nano particles), ions, etc. and it becomes a hot dense plasma that emits EUV light and/or radiation.

Generation of the EUV light and/or radiation via the LPP mechanism can also introduce generally undesirable side-effects, for example, such as contamination on optics surfaces and/or accumulation of Sn or other target material debris in the chamber environment or source vessel. Moreover, an arduous contamination problem may be introduced, and it may be generally desired to reduce such problem, for example, in order to address the so-called fall-on reticle defect. One significant source of the fall-on reticle defect is Sn or other target material fragments (for example, generated after bombarding the Sn or target with a high-power $CO_2$ drive or main-pulse laser) passing through an intermediate focus (IF) orifice of the EUV light source into the scanner system and then landing on the reticle. An alternate pathway is when Sn and/or other debris is built-up on surfaces or walls of the source chamber or vessel and such portions of such debris are dragged into the scanner system by adverse fluid flows near the IF orifice.

In some suitable embodiments, in the EUV source chamber or vessel, a dynamic gas lock (DGL) may be installed at or near the IF orifice as a defense mechanism against the fall-on reticle defect. For example, the function of the DGL is to form a gas barrier and/or gas flow to block Sn and/or other fragments from transferring from the EUV light source chamber or vessel to the scanner system. However, it can be experienced that a DGL may not provide a sufficient defense against the fall-on reticle defect by itself.

In some embodiments, electrical deflectors may be employed as a defense against the fall-on reticle problem, for example, by providing some deflection of Sn ions and/or charged particles away from or off of a trajectory headed toward the reticle or mask. However, such electrical deflectors may not provide a sufficiently effective defense by themselves. For example, electrical deflection is generally not effective against uncharged Sn debris and/or neutral or non-charged particles that can be produced in connection with the LPP mechanism. Additionally, Paschen's law may limit or prohibit usage of a sufficiently high voltage deflector to achieve a suitable degree of Sn debris and/or particle deflection.

Disclosed herein is an acoustic and/or other like deflection technique which can effectively deflect (and/or aid in the deflection of) Sn debris and/or other like particles away from and/or off of a trajectory headed toward the mask or reticle. One advantage of the deflection technique disclosed herein is that it can inhibit Sn debris and/or other like particles from reaching the mask and/or reticle and hence protect the mask and/or reticle from being struck by such Sn debris and/or other like particles that may result from the EUV light and/or radiation generation mechanism. Another advantage to the acoustic or other like deflection technique disclosed herein is that it can be effective even for Sn debris and/or other particles that are not electrically charged, i.e., for debris and/or particles which have a neutral electrical charge or substantially neutral charge. Still another advantage of the acoustic deflection technique disclosed herein is that it may be employed in combination with and/or to enhance other defense mechanisms used to guard against the fall-on reticle defect, for example, such as DGL and/or electrical deflection techniques.

FIG. 1 shows an extreme ultraviolet (EUV) photolithography system 610 in accordance with some embodiments of the present disclosure. Suitably, the system 610 is operable to perform lithography exposing processes with a respective radiation source and exposure mode. FIG. 1 shows a EUV light source 10 injecting EUV light through an orifice or hole of an intermediate focus (IF) cap 20 into a EUV scanner 613 including an illuminator 614 that illuminates a mask 618 (also referred to as a reticle) that is secured on a mask stage 616 by an electrostatic chuck (e-chuck) or the like. Suitably, for an EUV lithography system, the mask 618 is a reflective mask. A projection system 620 (also referred to as a projection optics box (POB)) of the EUV scanner 613 projects the image of the mask 618 onto a wafer 622 (for example, a silicon wafer on which integrated circuit fabrication is being performed) mounted on a substrate stage 624 by an e-chuck or the like and coated with photoresist to perform the EUV exposure. In some embodiments, the light source 10 generates EUV radiation (or light) with a wavelength centered at about 13.5 nm. Suitably, the projection optics module 620 includes reflective optics (for EUV) that are configured to image the pattern of the mask 618 onto the semiconductor wafer 622 secured on the substrate stage 624 of the lithography system 610. In practice, various elements can be added to and/or omitted from the lithography system 610, and the disclosed embodiments herein are not meant to be limited by that which is shown in FIG. 1. Also shown in FIG. 1 is one illustrative embodiment of an acoustic deflector system as disclosed herein, which in FIG. 1 includes an acoustic wave generator 92 and an acoustic reflector 94.

Figure 2:
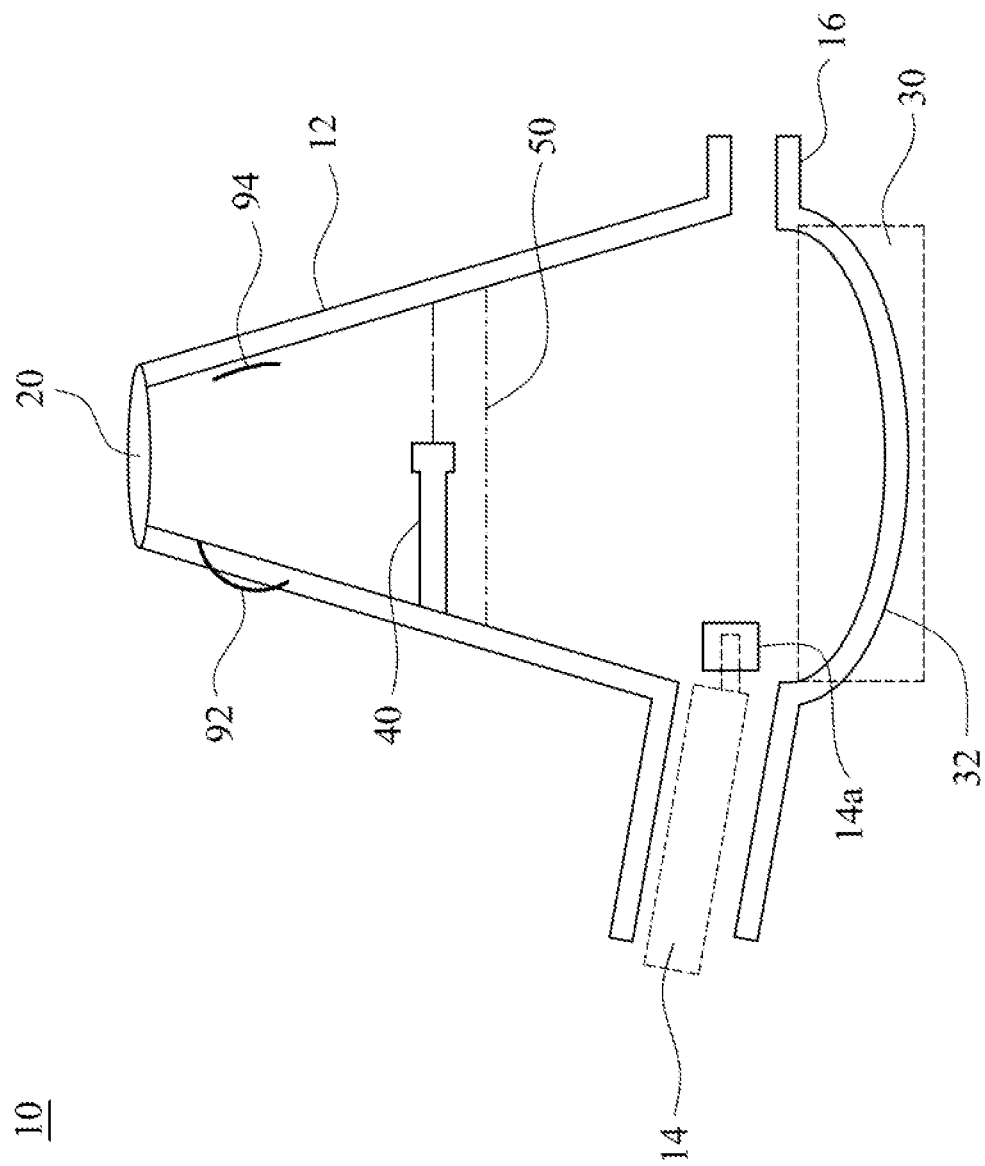

FIG. 2 shows in greater detail an example EUV light source 10 of the type used in EUV lithography and which may be employed in accordance with some embodiments disclosed herein. For example, the EUV light source 10 shown in FIG. 2 may be used as and/or correspond to the light source 10 shown in FIG. 1. As illustrated in FIG. 2, the EUV light source 10 is generally formed from or includes a housing to define a vessel 12 having at one end thereof an intermediate focus (IF) cap 20 including a hole or orifice therein through which generated EUV light exits the EUV light source 10 and at another opposing end a collector chamber 30 in which a collector mirror 32 is located and/or housed. In practice, the EUV light and/or radiation generated by the EUV light source 10 exits the EUV light source 10 through the IF cap 20 and upon exiting through the IF cap 20 it proceeds, travels and/or is directed toward and/or to the scanner 613 of the lithography system 610, i.e., more specifically, toward and/or to the mask and/or reticle 618. In one suitable embodiment, the chamber or vessel 12 and/or the walls thereof generally form a frustoconical shape. In some other embodiments, a generally cylindrical or other suitable shape may be taken. In practice, the walls of the vessel 12, the IF cap 20 and the collector chamber 30 (when the collector mirror 32 is installed therein) cooperate to define an environmentally controlled chamber in which EUV radiation and/or light is generated, collected and/or focused. Also shown in FIG. 2 is the acoustic wave generator 92 and the acoustic reflector 94.

Figure 3:
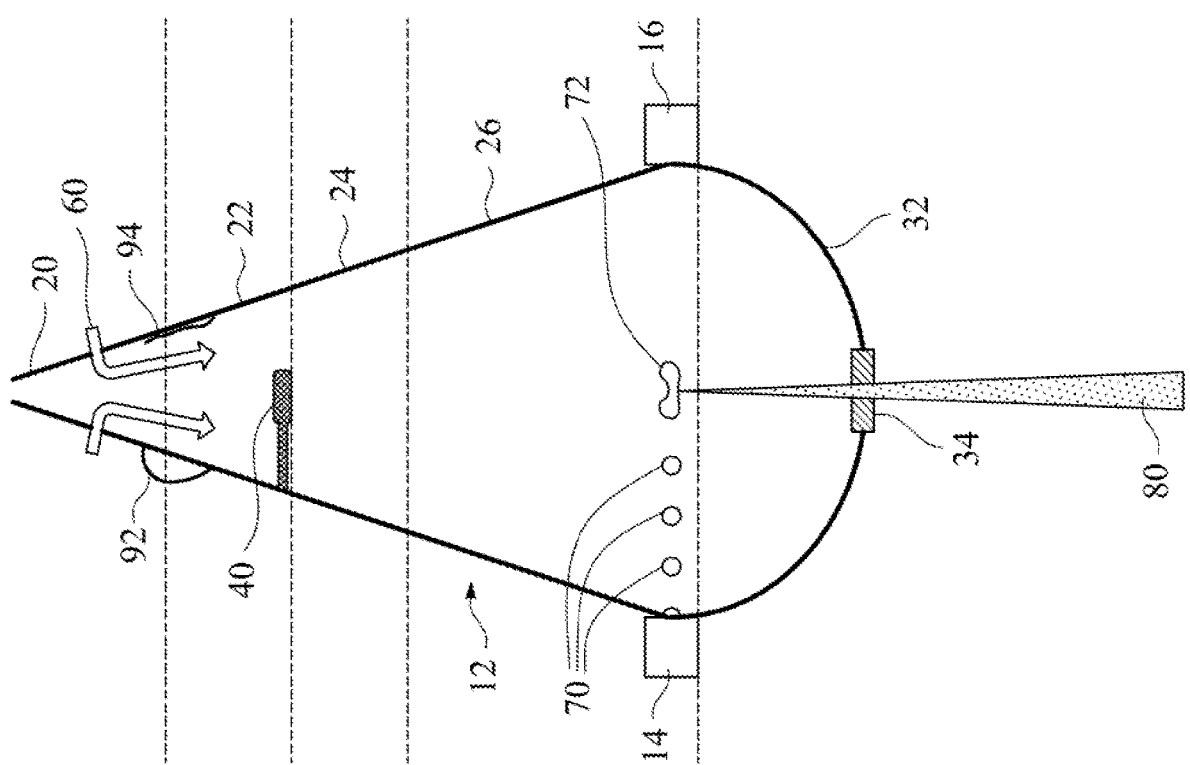

In practice, as illustrated in FIG. 3, the chamber of the EUV light source 10 may comprise and/or be defined by the IF cap 20, a lower cone region 22, a scrubber region 24, a vane region 26, and the collector mirror 32 (also referred to simply as the collector 32).

In one suitable embodiment, the EUV light source 10 is a laser-produced plasma (LPP) EUV light source, such as a pulsed Sn plasma EUV light source or the like, which employs a LPP mechanism or the like to generate or produce EUV light and/or radiation. In operation, the EUV light source 10 may be driven by a high power main-pulse laser (not shown) such as a carbon dioxide ($CO_2$) laser or other pulsed laser that injects or shoots a pulsed laser beam into the chamber or source vessel 12, for example, via an optical window 34 (for example, seen in FIG. 3). A pre-pulse laser (not shown) may also be provided. In suitable embodiments, the same laser may be employed as the main-pulse laser and the pre-pulse laser. In some embodiments, the laser beam is injected from under or behind the collector mirror 32 and passes through a small hole, aperture, window or opening arranged at or near a center of the collector mirror 32. In some embodiments, the collector mirror 32 is a multi-layer construction forming a reflective mirror at and/or about the operative wavelength of the EUV light source 10. The collector mirror 32 may be an elliptical mirror that has one focus at or near an ignition site (i.e., where the laser beam strikes a target) and a second focus at or near the IF cap 20.

Returning attention to FIG. 2, a target droplet generator (DG) 14 injects droplets of a target material (for example, Sn) through a port 14a into the environmentally controlled chamber of the EUV light source 10. The target droplet is generally propelled toward a droplet catcher 16 on an opposing side of the environmentally controlled chamber of the EUV light source 10. Suitably, the optical pulses of the laser are timed to impinge on the target droplets (for example, at or near the ignition site) as they pass through the vacuum chamber to produce a plasma which generates extreme ultraviolet (EUV) radiation and/or light, for example, having wavelengths, roughly spanning about a 1% to about a 2% FWHM (full-width half-maximum) bandwidth in a range centered somewhere around about 13.5 nm. In one embodiment, the EUV light source 10 produces EUV radiation and/or light having a wavelength ranging between about 1 nm and about 100 nm. The collector mirror 32 operates to reflect and/or focus the plasma generated EUV radiation toward the IF cap 20, through which the EUV light exits the EUV light source 10. Upon exiting, the EUV light from the source 10 may by further shaped and/or directed by an optical system to form a EUV light beam for use in EUV lithography.

In practice, the EUV light source 10 may include other components known in the art, for example, such as a buffer gas system, including a buffer gas source, that flows and/or establishes a buffer gas (for example, hydrogen) within the environmentally controlled chamber to aid in the reduction of environmental contamination, atomic tin deposition and/or residue built-up in the chamber. Also shown in FIG. 3 is the acoustic wave generator 92 and acoustic reflector 94 described herein. In some embodiments, a number of vanes (not shown) may be formed on and distributed around an inner wall of the vessel 12 (e.g., in the vane region 26 thereof as shown in FIG. 3) to provide receiving surfaces for target droplets and/or fragments thereof that may go astray. That is to say, some target droplets and/or fragments thereof produced by interaction with the laser pulses, on occasion, may not travel strictly in the desired path toward the droplet catcher 16, and when they are incident on the inner wall(s) of the source vessel 12, the vanes act to retain the Sn or other liquid target material. The vanes are optionally heated to above the melting temperature of the material of the target droplets using any suitable manner of heating. In addition, a gutter (not shown) may be provided at one end of the vanes and connected to a drain (not shown) in order to recover the stray target material flowing from and/or along the vanes. It is noted that while the vessel 12 is illustrated oriented vertically in FIGS. 2 and 3, in practice it may be installed tilted at an angle.

As shown in FIGS. 2 and 3, for example, a horizontal obstruction (HO) bar 40 is optionally installed in the EUV light source 10, for example, at or near the lower cone region 22 of the vessel 12. The HO bar 40 operates to and/or aids in blocking laser light from exiting through the IF cap 20 when it is not impinging upon target droplets. Also shown in FIG. 2 is a scrubber 50, for example, located at or near the scrubber region 24 of the vessel 12, which operates to and/or aids in vacuuming out, removing and/or otherwise cleaning contaminates, particles, residue and the like from any buffer or other gas used in the environmentally controlled chamber.

In one particular embodiment, the collector mirror 32 is suitably contained in a drawer or the like which is selectively placed and/or housed in the collector chamber 30. In one suitable embodiment, the drawer containing the collector mirror 32 is selectively positioned in or out of the collector chamber 30. During operation of the EUV light source 10, the drawer is placed and/or positioned in the collector chamber 30 thereby installing the collector mirror 32 in the EUV light source 10 so that it may collect and/or focus the generated EUV radiation created as the periodically or intermittently injected target droplets are struck by the laser pulses. During down time or when the EUV light source 10 is otherwise not in operation, the drawer containing the collector mirror 32 may be selectively removed from and/or positioned outside the collector chamber 30, for example, to allow for the ready inspection, cleaning, maintenance and/or replacement of the collector mirror 32.

As shown in FIG. 3, a DGL 60 may also be provided, for example, at or near the IF cap 20. In practice, the DGL 60 may comprise one or more gas inlets that inject a gas (for example, hydrogen ($H_2$) or another suitable gas) into the vessel 12 at or near the orifice or hole formed in the IF cap 20 for the exiting EUV light. In some suitable embodiments, the injected gas from the DGL 60 forms a gas barrier or gas flow that inhibits Sn debris and/or other like particles from exiting the EUV light source 10 through the IF cap 20. Accordingly, the DGL 60 is graphically represented by respective arrows. In practice, however, the DGL 60 may in fact be fashioned from suitable physical components.

FIG. 3 also shows some further detail in accordance with some suitable embodiments of the EUV light source 10. In FIG. 3, droplets 70 of a target material (for example, such as Sn) are shown being propelled across the chamber of the EUV light source 10 from the DG 14 toward the droplet catcher 16. In practice, as a stream of the droplets 70 are propelled across the chamber, they may in turn be formed into and/or take the shape of a pancake or elongated target 72, for example, in accordance with the droplets being struck by one or more pre-pulses from a laser as described above. In addition, some ions and vapor or the like may also be produced from the target material as a result of the droplet being struck with the pre-pulse. When the pancake shaped or elongated target 72 arrives at or near the primary focus (PF) of the collector 32, a main-pulse with highly intense power is focused thereon, for example, from a main-pulse laser. The pre-pulse and/or main-pulse from one or more lasers are represented graphically in FIG. 3 and indicated by reference numeral 80. In operation, the EUV light source 10 may be driven by a high power laser (not shown) such as a carbon dioxide ($CO_2$) laser or other pulsed laser that injects or shoots a pulsed laser beam 80 into the chamber or source vessel 12, for example, via the optical window 34. In any event, the thermal energy from the main-pulse generally induces the pancake shaped or elongated target 72 to generate an abundance of fragments, vapor (for example, neutral atoms and/or nano particles), ions, etc. and it becomes a hot dense plasma that emits EUV light and/or radiation which is directed (for example, via the collector 32 and/or otherwise) along a pathway which extends through the IF cap 20, out of the EUV light source 10 and toward the mask or reticle 618 of the EUV scanner 613 (for example, as shown in FIG. 1). In general, as a result of being struck by the pre-pulse and/or main-pulse, ions, vapor, fragments, atoms or nano-particles and/or other charged and/or neutral debris of Sn or other target material may be produced from the target 72. Generally, some of the generated debris and/or particles may tend to travel along the pathway and/or on a trajectory (at least initially) which would result in them striking and/or landing on the reticle 618, i.e., resulting in the so-call fall-on reticle defect.

In part, the DGL 60 may act to block or inhibit some of the generated debris and/or particles from exiting the chamber of the EUV light source 10 through the IF cap 20 and/or otherwise reaching the reticle 618. In some suitable embodiments, the DGL 60 is suitably effective to block or inhibit generated debris and/or particles from exiting the chamber of the EUV light source 10 through the IF cap 20 and/or otherwise reaching the reticle 618, for example, via deflection or otherwise of the same, when the debris or particles are, for example, below about 100 μm in diameter and/or are traveling at speeds below about 100 m/s. However, the DGL 60 alone may not be completely effective. That is to say, for example, without assistance or other remedial measures, larger and/or more energetic debris and/or particles (for example, above about 100 μm in diameter and/or traveling at speeds above about 100 m/s) may be able to penetrate the gas flow and/or barrier produced by the DGL 60 and then hit the reticle or mask 618.

Accordingly, in some suitable embodiments, an acoustic deflection system or mechanism may be employed to enhance the effectiveness of the DGL 60 and/or to deflect debris and/or particles away from and/or off of a trajectory that would otherwise result in the debris or particles striking and/or landing on the mask or reticle 618. In practice, the acoustic deflection system functions to create or establish one or more longitudinal mechanical waves (graphically represented by the wave form indicated at reference numeral 90 in the relevant FIGURES) extending across the pathway leading to the mask or reticle 618 (generally represented graphically in the relevant FIGURES by the dashed arrow 100). In FIGS. 1-3, an illustrative embodiment of an acoustic deflection system includes an acoustic wave generator 92 and an acoustic reflector 94.

Figure 4:
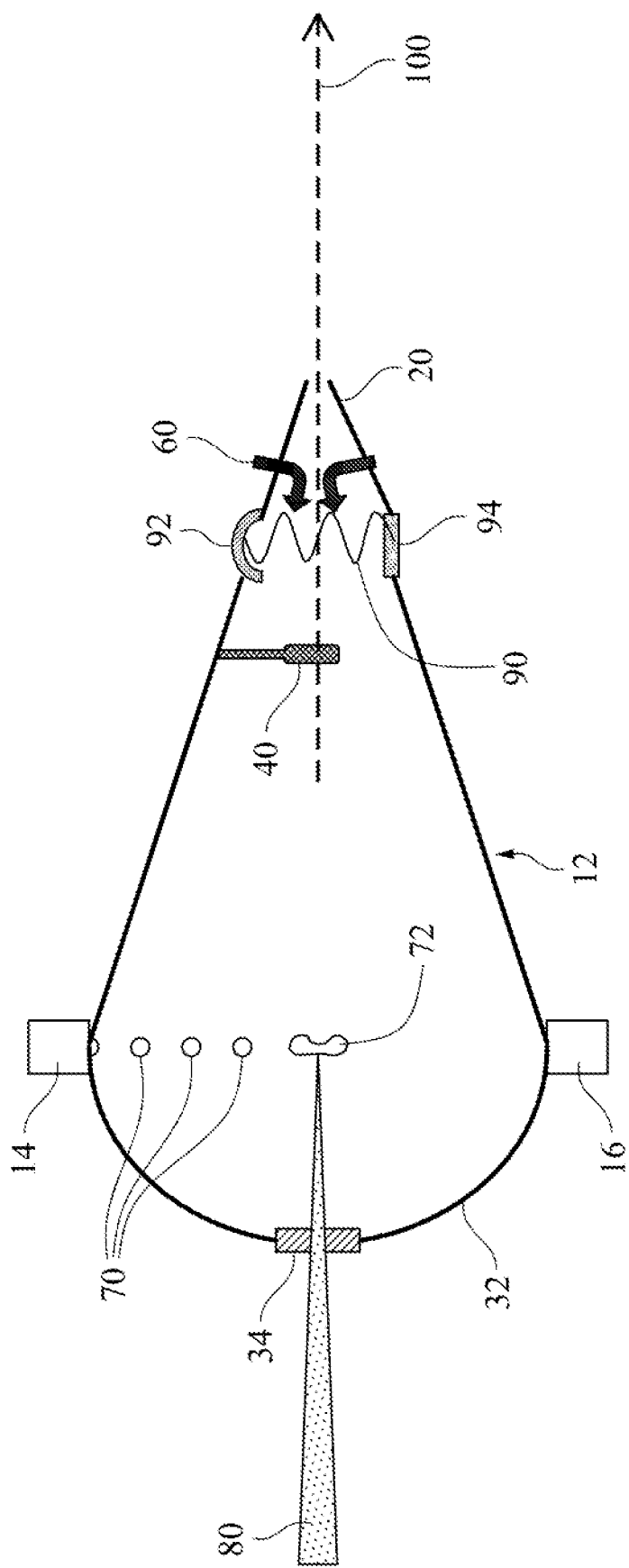

As shown in additional detail in FIG. 4, the acoustic deflection system includes a longitudinal mechanical wave generator 92 and reflector 94. The wave generator 92 may be any suitable device that generates an appropriate longitudinal mechanical or acoustic wave, for example, without limitation, such as a speaker, or a piezoelectric, electroacoustic, electromechanical, ultrasonic or other suitable transducer, or other vibrating device, or the like. In some suitable embodiments, the wave generator 92 selectively generates an acoustic wave, a supersonic wave, a subsonic wave, an ultrasonic wave or an infrasonic wave. In some suitable embodiments, the reflector 94 is situated at a distance across from the wave generator 92 so as to have the generated longitudinal wave 90 impinge thereon and be reflected therefrom. In practice, the reflector 94 may be constructed of any suitable material and formed in any suitable shape to effectively reflect the generated longitudinal mechanical wave.

In some suitable embodiments, the wave generator 92 may be situated on a first side of the pathway 100 leading to the reticle or mask 618, for example, as shown in FIG. 4, in the lower cone region 22 of the vessel 12 and/or at or near the IF cap 20, or otherwise in a vicinity of the DGL 60. The reflector 94, as shown in FIG. 4, may be situated on a second side of the pathway 100 leading to the reticle or mask 618, for example, opposite the first side and facing the wave generator 92. Accordingly, the longitudinal mechanical wave generated by the wave generator 92 is first projected from the wave generator 92 across the pathway 100 (i.e., which leads to the mask or reticle 618) and toward the reflector 94 which reflects the longitudinal mechanical wave therefrom back across the pathway 100 (i.e., which leads to the mask or reticle 618) and generally toward the wave generator 92.

In some suitable embodiments, the wave generator 92 and/or reflector 94 may be contained and/or housed within the vessel 12. For example, the wave generator 92 and/or reflector 94 may be mechanically mounted or adhered to interior walls and/or surfaces of chamber or vessel 12. In some alternative embodiments, the wave generator 92 and/or reflector 94 may be mechanically mounted or adhered to exterior walls and/or surfaces of the chamber or vessel 12. In one suitable embodiment, a hole or opening may be drilled and/or otherwise formed in a wall of the chamber or vessel 12 or IF cap 20, and the wave generator 92 inserted into that hole or opening so that the diaphragm or other vibrating element of the acoustic wave generator 92 is exposed inside the vacuum vessel 12. Vacuum-tight electrical feedthroughs pass through the hole or opening to provide electrical power to the wave generator 92. In other embodiments, the acoustic wave generator 92 may be integrated into a vacuum flange, for example a conflat (CF) flange that makes a vacuum-tight seal with a mating CF flange on a nipple of the vacuum chamber 12 using a copper gasket. Employing a flange arrangement advantageously facilitates removal and reinstallation of the acoustic wave generator 92 for cleaning, replacement, or other maintenance. In some suitable embodiments, the reflector 94 may be a wall or surface (or some portion thereof) of the vessel 12 which is situated opposite the wave generator 92. In other embodiments, the reflector 94 may be a separate distinct element and/or formed from an appropriate material and/or suitably shaped for reflecting the generated longitudinal mechanical wave. Again, in these latter embodiments the reflector 94 may optionally be mounted on a vacuum flange for convenience in performing maintenance on (e.g. cleaning of) the reflector.

Suitably, the longitudinal mechanical wave 90 may take the form of a propagating acoustic wave, or alternatively, a standing acoustic wave may be established. In one suitable embodiment, the wave generator 92 and the reflector 94 are spaced apart from one another by a distance and/or otherwise situated with respect to one another such that the originally projected wave from the wave generator 92 and the reflected wave returning form the reflector 94 interfere with one another in such a way so as to establish a standing longitudinal mechanical wave between the wave generator 92 and the reflector 94. One advantage of establishing a standing wave is the potential to effectively trap debris and/or particles, for example, between nodes of the standing wave.

In some suitable embodiments, a second wave generator may take the place of the reflector 94 opposite the first wave generator 92. Accordingly, instead of reflecting the originally generated wave from the first wave generator 92, the second wave generator may generate a suitable second longitudinal mechanical wave directed generally toward the first wave generator 92, for example, the second wave interfering with the first wave in such a manner so as to establish the standing wave.

In some embodiments, the acoustic forces introduced by the longitudinal mechanical wave(s) act to divert or deflect debris and/or particles, initially traveling generally along the pathway 100 leading to the mask or reticle 618, away from and/or off of a trajectory that would otherwise result in the debris or particles striking and/or landing on the mask or reticle 618. Notably, the pathway 100 leading from the vessel 12 through the IF cap 20 and to the mask or reticle 618 (i.e., the pathway followed by the generated EUV light) can be relatively long, for example, about a few tens of centimeters to a few meters in some nonlimiting illustrative embodiments. Accordingly, at a sufficiently early position along that relatively long pathway (for example, at or near the IF cap 20), even a relatively minor deviation of debris and/or particles from their original trajectories following the pathway 100 can result in the debris and/or particles not ultimately hitting, landing on or otherwise reaching the mask or reticle 618.

The acoustic forces accompanying the generated longitudinal mechanical wave(s) can not only cause deflection of fast moving debris and/or particles so as to divert them from a dangerous and/or undesirable trajectory which would otherwise result in reticle fall-on, but the acoustic forces accompanying the generated longitudinal mechanical wave(s) can also affect the momentum of such debris and/or particles in such a manner as to slow down the debris and/or particles, for example, resulting in a higher residence time of the debris and/or particles within the source vessel 12, thereby in essence assisting the DGL 60 and/or enhancing the effectiveness of the DGL 60. That is to say, this higher residence time enables a favorable $H_2$ or other gas flow (for example, from the DGL 60) to exert its drag force or the like for a larger time on the debris and/or particles, thereby resulting in a larger impulse and/or change of momentum to the debris and/or particles. In some instances, a particle may even get trapped in between consecutive nodes of a standing waves. The trapped particle may then be subject to eventual removal, for example, by the DGL 60, scrubber 50 and/or other chamber cleaning fluid flows.

As shown in FIG. 4, for example, the acoustic deflection system (i.e., the wave generator 92 and/or reflector 94) is situated in a vicinity of IF cap 20 and/or the DGL 60. Accordingly, the longitudinal mechanical wave is established in this same vicinity. There are a number of advantages to this particular arrangement and/or placement of the acoustic deflection system. Generally, the gas density (for example, $H_2$ density) within the vessel 12 tends to be relatively higher in this vicinity of the chamber or vessel 12, for example, as compared to some other or more central regions of the chamber or vessel 12. Accordingly, to some advantage, the longitudinal mechanical wave(s) established in this relatively denser medium can be relatively more effective, i.e., achieve relatively greater and/or more efficient energy propagation via compression and decompression of the $H_2$ or other gas medium in which the longitudinal mechanical wave is established. Additionally, this vicinity is proximate to the beginning of the relatively long pathway 100 leading from the vessel 12 through the IF cap 20 and to the mask or reticle 618 (i.e., the pathway followed by the generated EUV light). Accordingly, to some advantage, only a relatively minor deviation to a particle's initial trajectory in this vicinity can cause the particle to ultimately be diverted from reaching the reticle 618. Another advantage to locating the acoustic deflection system near the DGL 60 is that the acoustic deflection system may better assist and/or enhance the effectiveness of the DGL for example, by slowing the debris and/or particles and/or otherwise increasing the residence time of debris and/or particle within the vicinity of the DGL 60.

Figure 5:
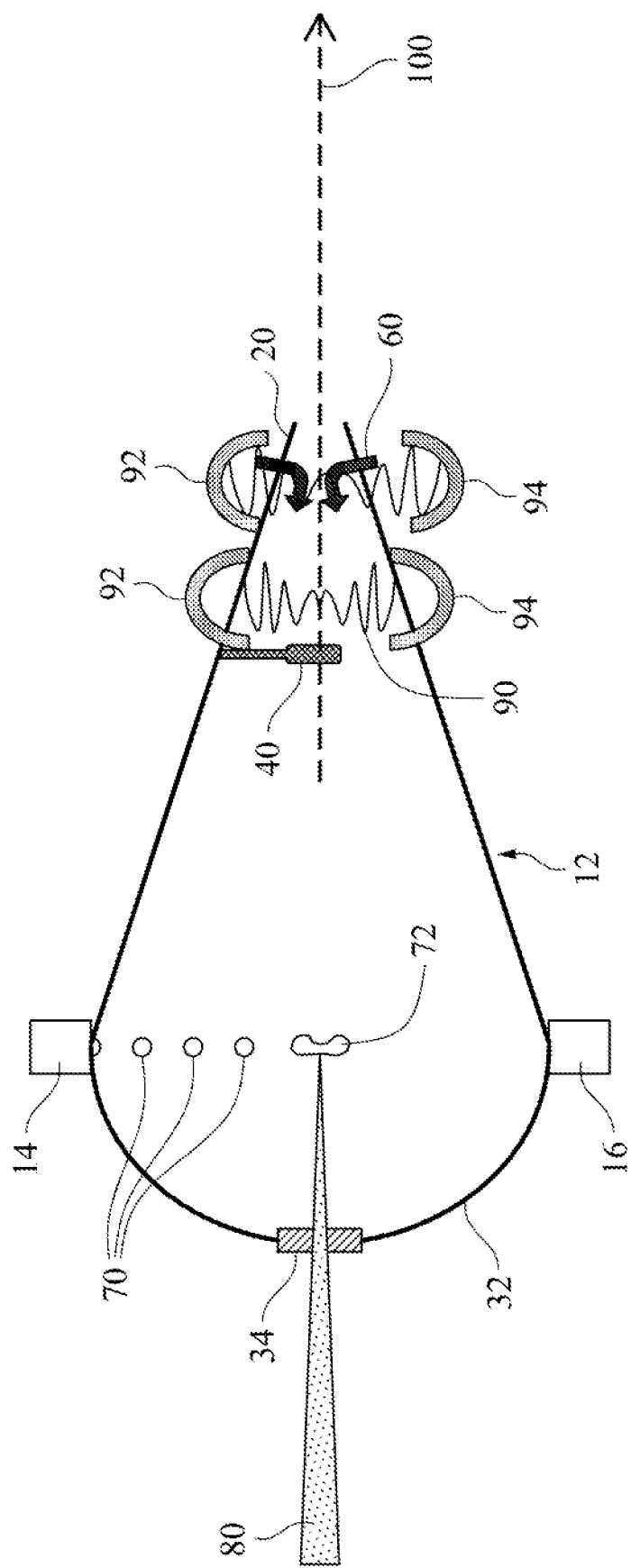

FIG. 5 show another embodiment of the acoustic deflection system. As shown in FIG. 5, the acoustic deflection system may suitably comprise a plurality of wave generators 92 and corresponding reflectors 94. For simplicity, only two wave generators 92 and two corresponding reflectors 94 are illustrated in FIG. 5. However, it is to be appreciated that more than two pairs of wave generators 92 and reflectors 94 may be employed in practice. As shown, the wave generator-reflector pairs are oriented facing one another from opposite sides of the EUV light pathway 100 leading to the mask or reticle 618, such that the longitudinal mechanical waves 90 projected and/or reflected between a given pair do not cross one another. Suitably, the direction of the wave generators 92 and the reflectors 94 are adjusted to achieve efficient and sufficiently intense deflection of debris and/or particles initially following a trajectory along the pathway 100 through which the longitudinal mechanical waves 90 extend. In some suitable, embodiments, the longitudinal mechanical wave or waves established between one wave generator-reflector pair may cross the longitudinal mechanical wave or waves established between another wave generator-reflector pair. Comparison of FIGS. 4 and 5 also illustrates that the reflector 94 can have various geometries, such as a planar reflector in FIG. 4 or a curved (e.g., parabolic) reflector in FIG. 5. In general, the detailed shape of the reflector 94, as well as the design of the acoustic wave generator 92, can be tailored to produce a desired acoustic wave pattern, for example to produce focused acoustic energy at a target location inside the vessel 12.

Figure 6:
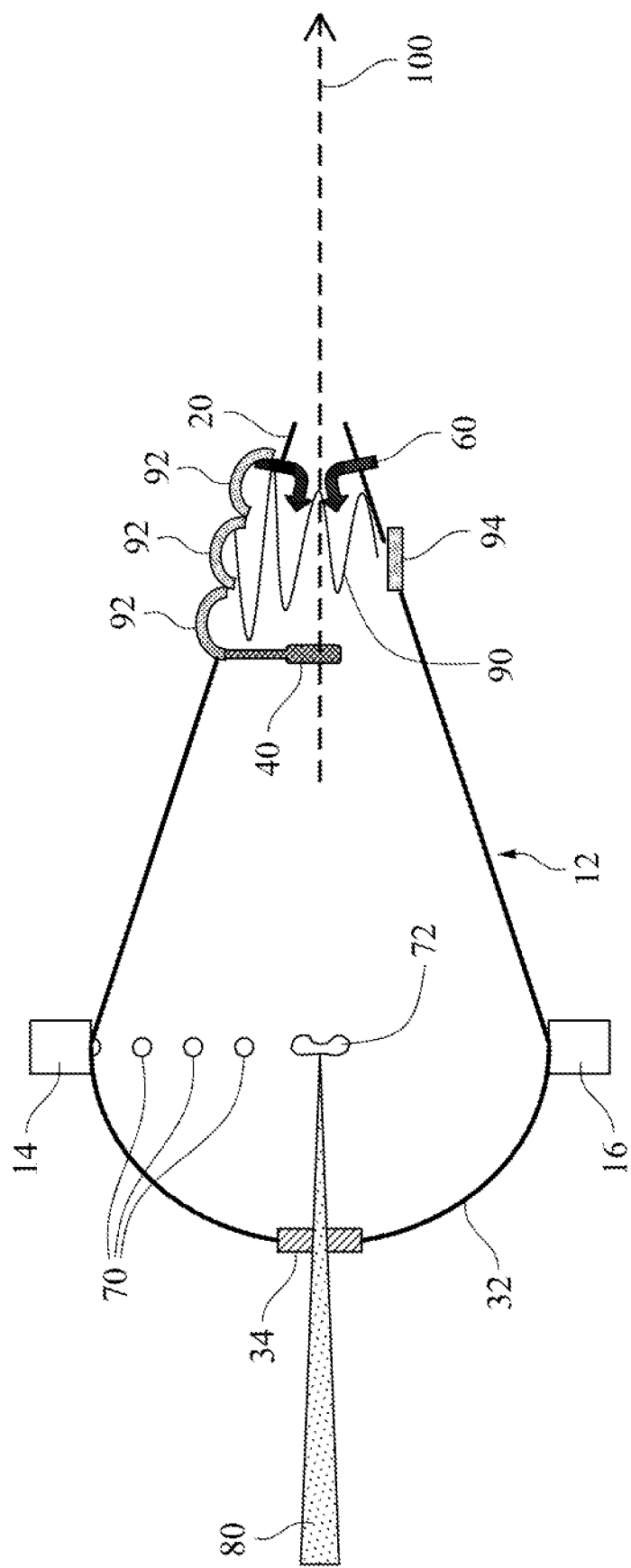

As shown in yet another embodiment depicted in FIG. 6, a plurality of wave generators 92 may be operatively coupled a common reflector 94. Advantageously, the ensemble of wave generators 92 may be capable of collectively producing a relatively higher amplitude longitudinal mechanical wave, for example, as compared to a single wave generator having a similar output capability as one of the plurality of wave generators 92.

Figure 7:
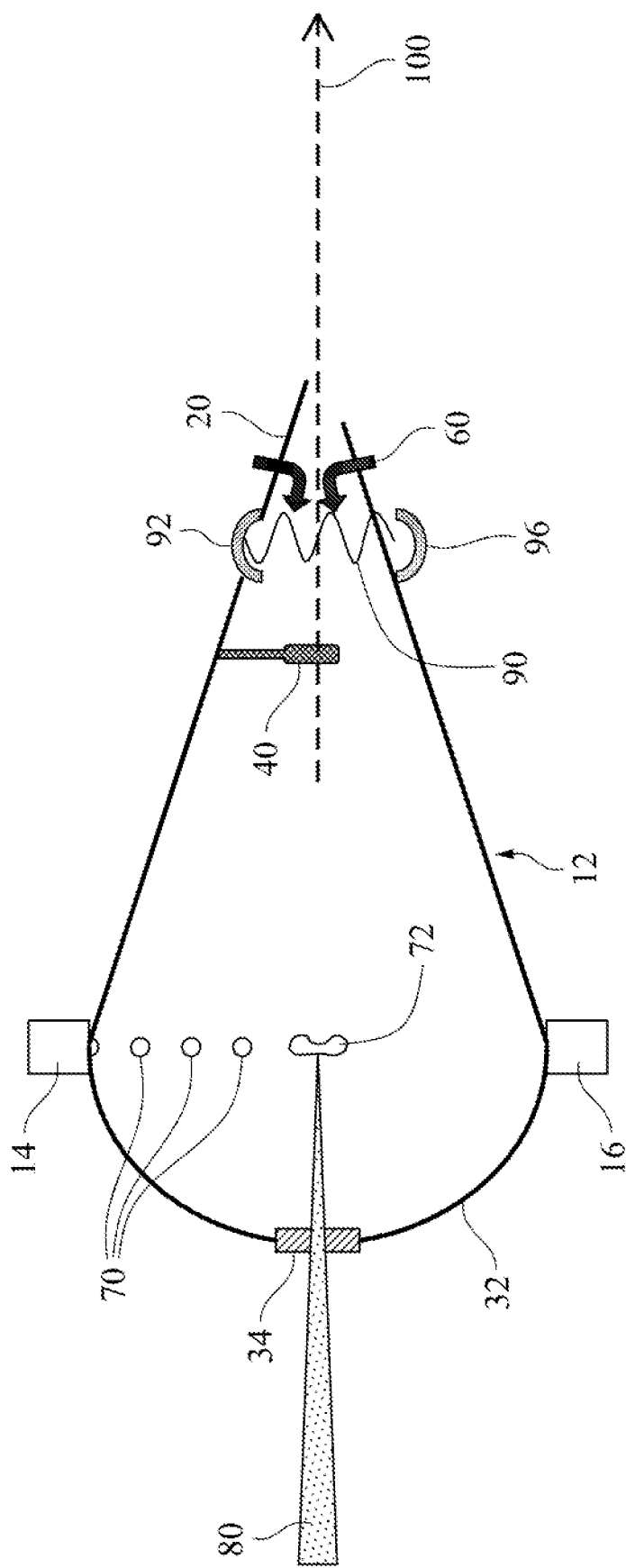

In some embodiments, for example, as shown in FIG. 7, an absorber or sink 96 may take the place of a reflector 94, for example, such as the reflector 94 shown in FIG. 4. Suitably, the absorber or sink 96 is made of a material and/or shaped or otherwise formed such that it functions and/or operates to substantially absorb the longitudinal mechanical wave 90, and/or a bulk of the energy associated therewith, impinging thereon, for example, as opposed to reflecting it. In practice, the wave generator 92 is operated to generate a relatively high amplitude, yet controlled, longitudinal mechanical wave 90 to perturbate the medium (for example, $H_2$ or other gas) in which the wave is established. The resulting shock wave traverses through the medium thereby deflecting debris and/or particles so that they do not reach the mask or reticle 618. Suitably, the absorber or sink 96 receives the wave and absorbs or otherwise dampens the same, for example, to guard against reverberation from the wave potentially causing damage to the vessel 12 and/or other components of the EUV light source 10.

Figure 8:
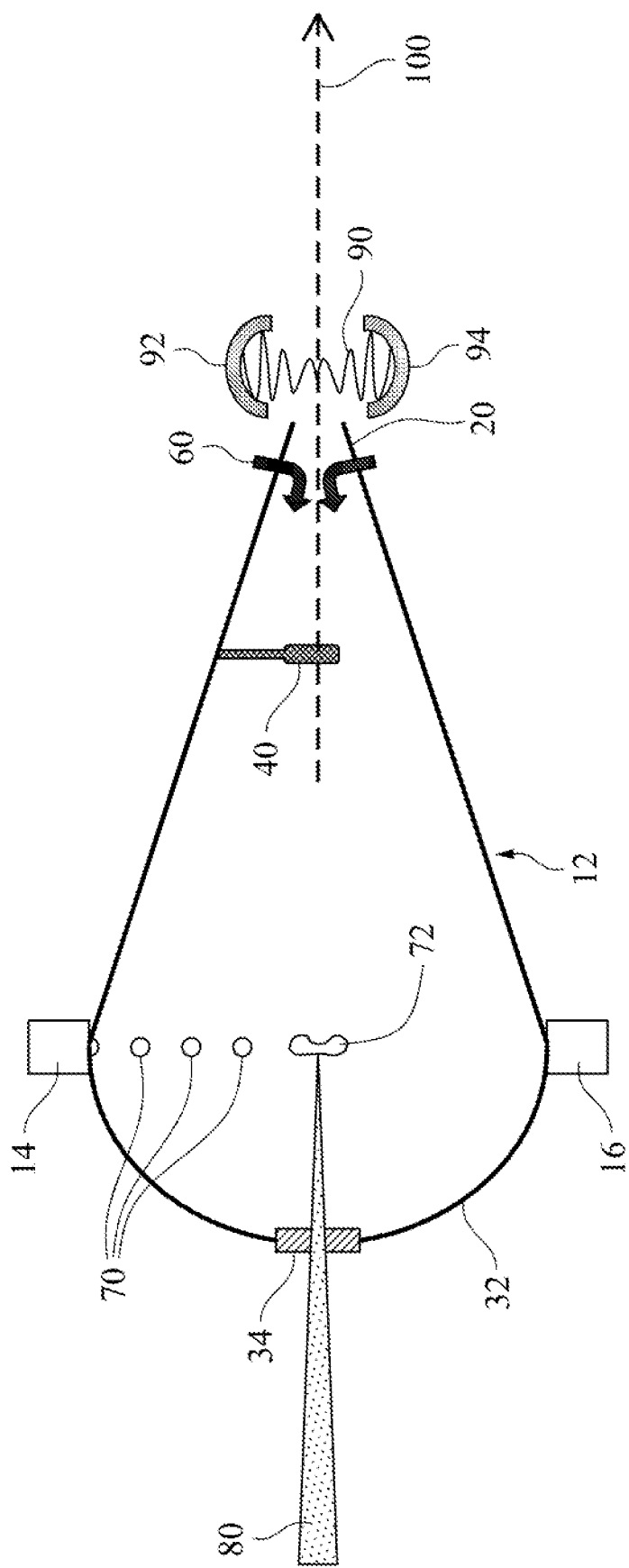
Figure 9:
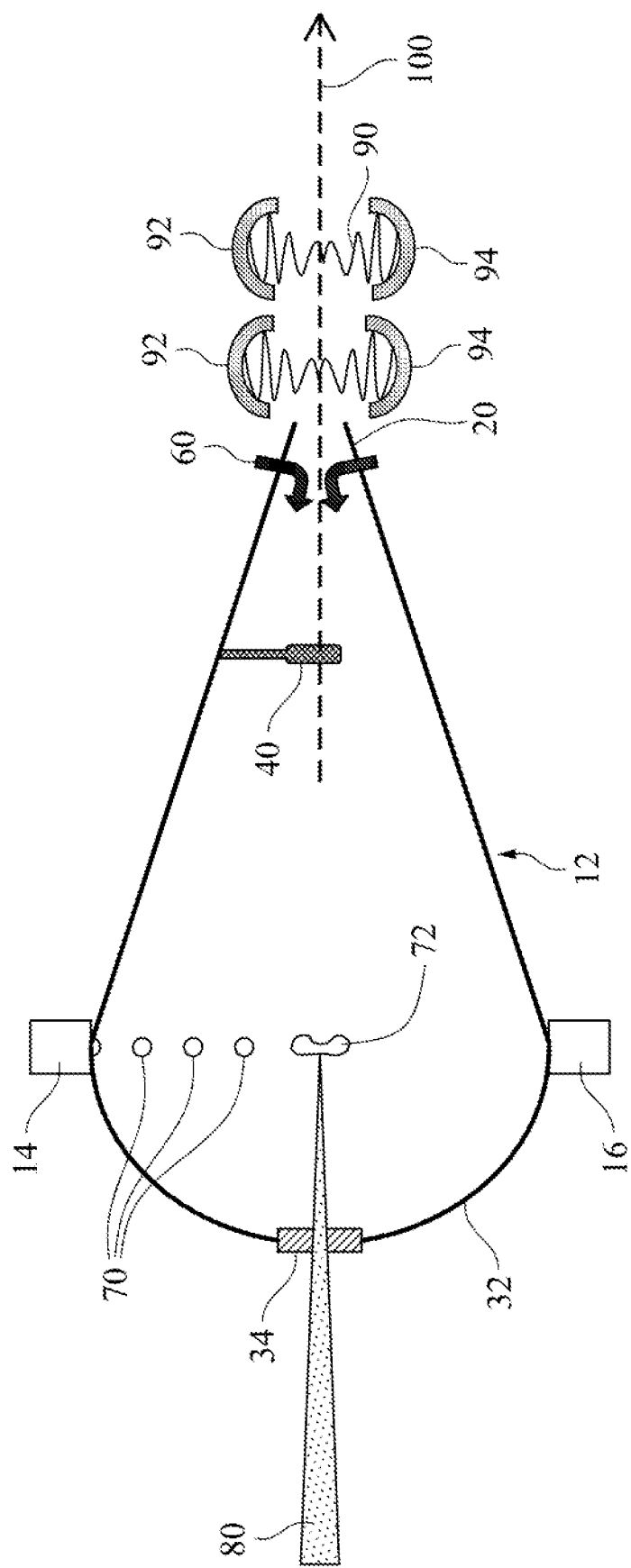

The embodiment shown in FIG. 8 is similar to the embodiment depicted in FIG. 4. Likewise, the embodiment of FIG. 9 is similar to the embodiment depicted in FIG. 5. However, in the embodiments of FIGS. 8 and 9 (as opposed to the embodiments of FIGS. 4 and 5), the acoustic deflection system (i.e., the wave generators 92 and reflectors 94) may be installed and/or situated just beyond or after the IF cap 20. Such an arrangement has the advantage that operation of the acoustic deflection system and/or any established longitudinal mechanical wave 90 is less likely to interfere with and/or effect operation of the EUV light source 10, for example, insomuch as the wave generators 92 and reflectors 94 reside outside the vessel 12, i.e., past or beyond the IF cap 20.

Figure 10:
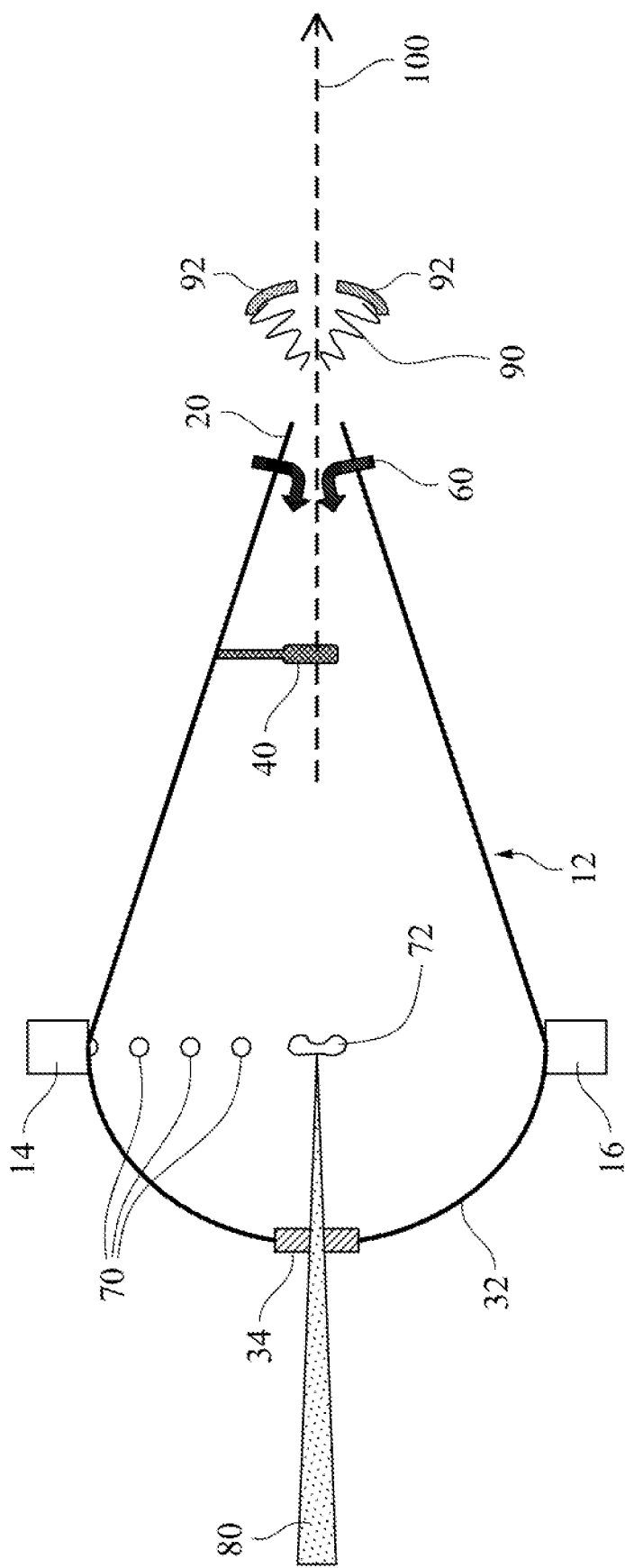
Figure 11:
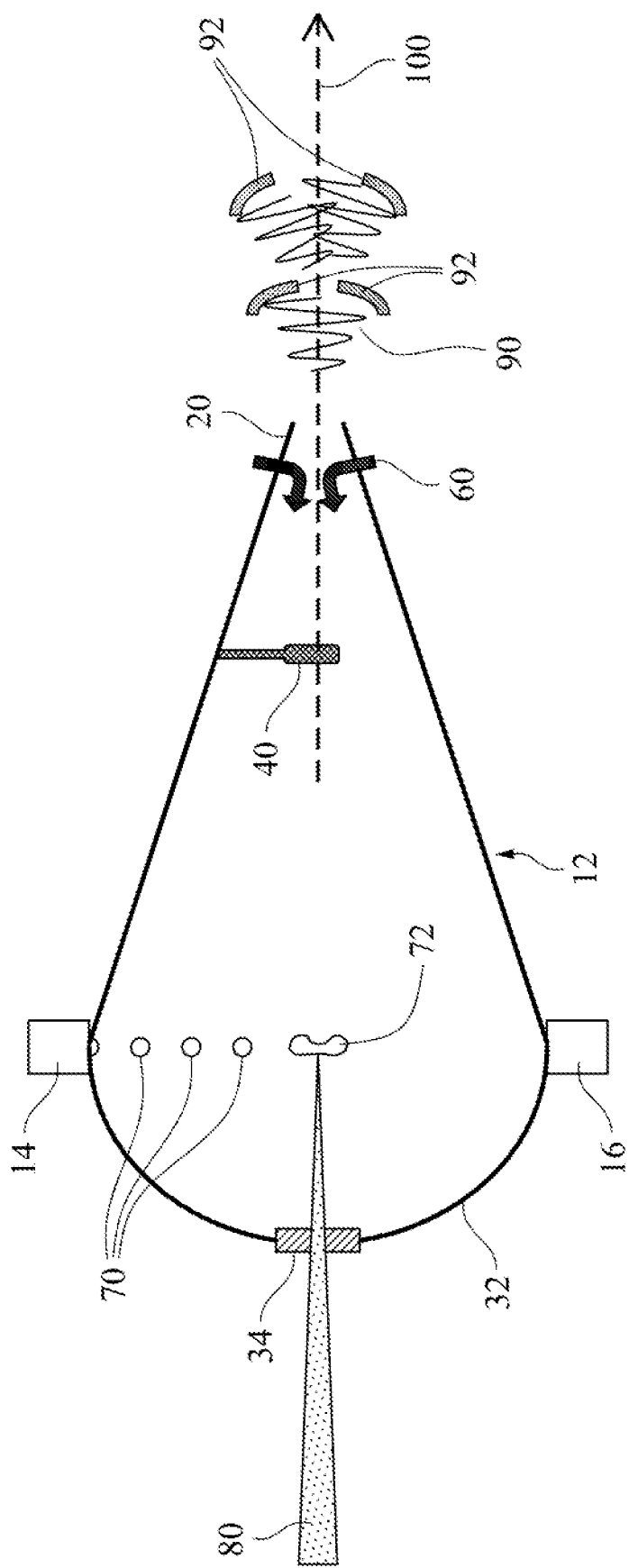

FIGS. 10 and 11 show other suitable embodiments where one or more wave generators 92 are installed and/or situated outside the EUV light source 10 and/or the vessel 12, for example, just beyond or past the IF cap 20. As shown, the wave generators 92 in these embodiments, be it a speaker or the like, may be essentially hollow, donut shaped or toroidal (i.e., with a hole or passageway formed therein) such that the pathway 100 of the generated EUV light passes therethrough on its way to the mask or reticle 618. In this way, the wave generators 92 do not obstruct the generated EUV light from reaching the reticle or mask 618. In some suitable embodiments, the HO bar 40 and/or the collector 32 may serve as a reflector for the generated longitudinal mechanical wave projected from the wave generator 92, and a standing wave may be established by suitable interference between the originally projected wave and the reflected wave, for example, to trap and/or deflect debris and/or particles efficiently. In some suitable embodiments, each wave generator 92 in such embodiments may consist of one toroid or they may be split into multiple parts, for example, each part having a corresponding reflector or absorber associated therewith.

Figure 12:
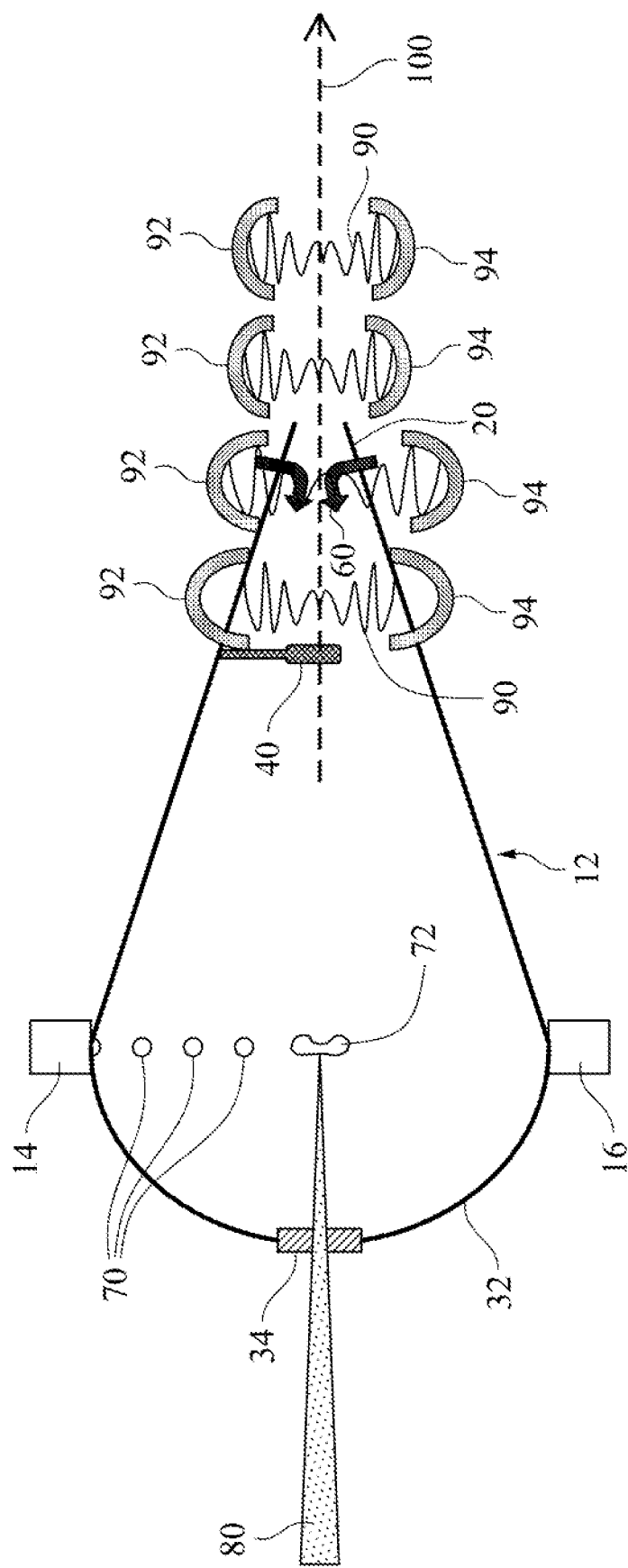

FIG. 12 shows still another embodiment. As shown in FIG. 12, one or more wave generator-reflector pairs may be installed both within and/or about the vessel 12 and just beyond or after the IF cap 20.

In some embodiments, for example, in any one or more of the embodiments shown in FIGS. 4-12, the frequency and/or amplitude of any one longitudinal mechanical wave 90 generated by any one of a plurality of wave generators 92 may be different. That is to say, a first wave generator may generate a wave at a first frequency f1 and amplitude a1, while a second wave generator may generate another wave at a second frequency f2 and amplitude a2, for example, where f2 is not equal to f1 and/or a2 is not equal to a1, and so on for each wave generator 92. Moreover, the frequencies and/or amplitudes of each generated wave may be varied over time. Further, in some suitable embodiments, one or more of the wave generators 92, the reflectors 94 and/or the absorbers or sinks 96 may be optionally coupled to a controllable actuator 98 (see, for example, FIG. 13) which selectively adjusts the orientation and/or direction of the wave generator 92, reflector 94 and/or absorber/sink 96 coupled to the given actuator. In this way, the frequency, amplitude and/or direction of various different longitudinal mechanical waves can be selectively tuned to achieve a desired wave pattern, wave interference and/or otherwise, for example, to sufficiently and/or efficiently deflect or otherwise inhibit debris and/or particles from reaching the mask or reticle 618. It is further noted that while the illustrative embodiments are directed to acoustic deflectors for EUV light sources, the disclosed acoustic deflectors may also be employed in conjunction with other types of short-wavelength light sources used in lithography, material or device characterization, or so forth. For example, the disclosed acoustic deflectors are contemplated for use in conjunction with EUV light sources, soft x-ray light sources, or so forth.

Figure 13:
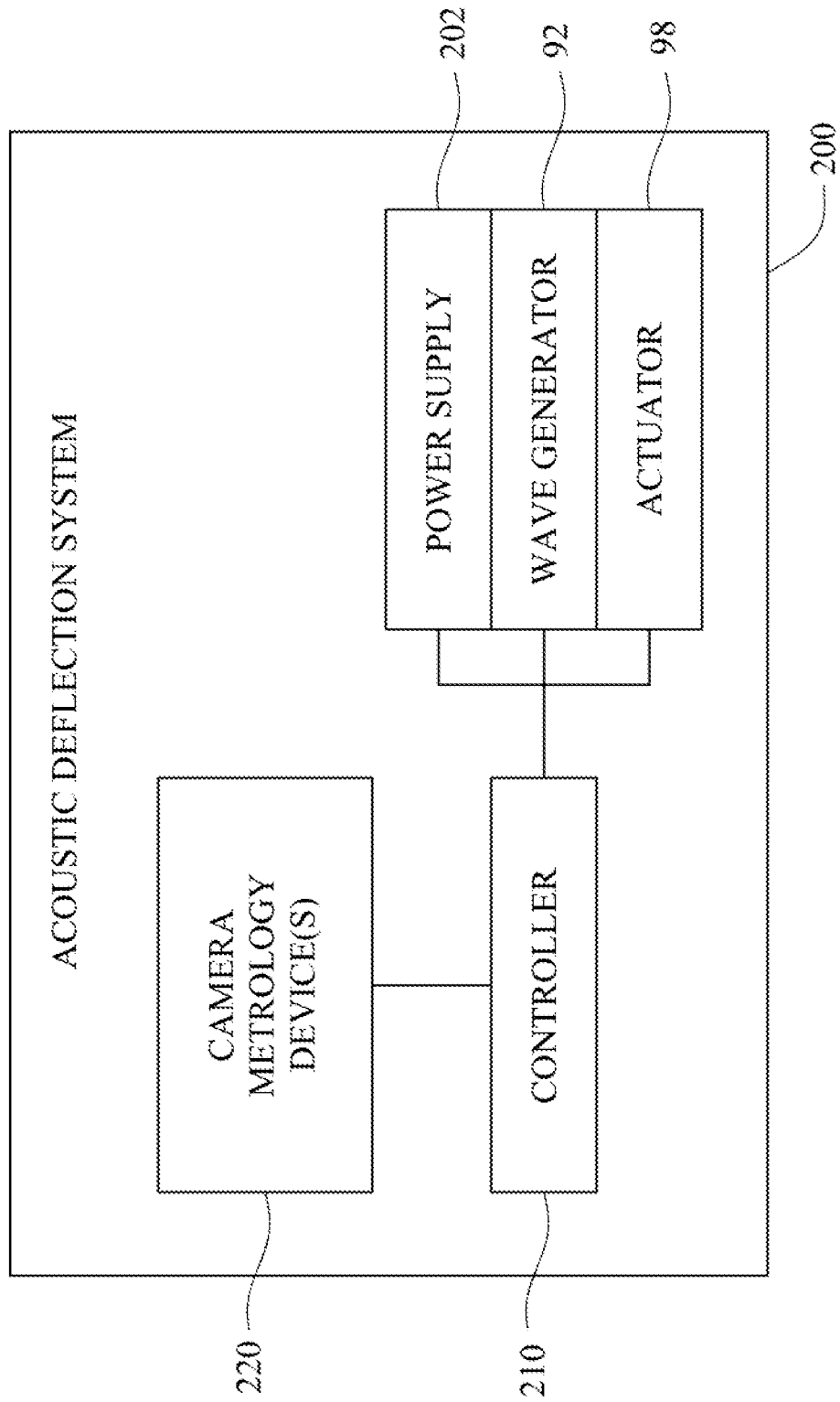

With reference to FIG. 13, there is shown a graphical representation of a suitable system 200 employing the acoustic deflection technique disclosed herein.

As shown, the system 200 includes a wave generator 92 which is driven by a power source 202 to generate a longitudinal mechanical wave. Suitably, the wave generator 92 and/or corresponding power supply 202 are regulated by a controller 210 to selectively generate a longitudinal mechanical wave at a selected frequency and/or selected amplitude, each of which may selectively be varied over time. In some suitable embodiments, the wave generator 92 is coupled to an actuator 98 that, under the direction of the controller 210, orients and/or points the wave generator 92 in a selected direction. The system 200 may further include one or more cameras, sensors, detectors and/or other like metrology devices 220 that monitor debris and/or particles and/or their trajectories as well as the gas flow and/or gas density, pressure and/or other environmental conditions, for example, within the vessel 12. Suitably, the controller 210 receives as input or feedback, the signals and/or output from these cameras and/or measurement taking devices 220. In turn, based on this input or feedback, the controller 210 may employ smart algorithms, programming and/or suitable logic to regulate the wave generator 92, power supply 202 and/or actuator 98, for example, thereby adjusting and/or tuning the frequency, amplitude and/or direction of the generated longitudinal mechanical wave as appropriate and/or desired, for example, to optimize the degree and/or efficiency of debris and/or particle deflection. In some suitable embodiments, such adjustments and/or tuning may take place in real time or near real time (i.e., during operation of the EUV light source 10) based on the currently monitored debris and/or environmental conditions reported to the controller 210 by the cameras, sensors, detectors and/or other metrology devices 220. Likewise, based on the provided feedback from the cameras, sensors, detector and/or other metrology devices 220, the controller 210 may control and/or regulate the power supply 202 and/or wave generator 92, for example, to selectively modulate (i.e., periodically and/or intermittently turn on and/or off) generation of the longitudinal mechanical wave as appropriate and/or desired, for example, to efficiently achieve deflection of monitored debris and/or particles.

For simplicity, FIG. 13 shows only a single wave generator 92, power supply 202 and/or actuator 98 regulated by the controller 210. However, in practice, the controller 210 may likewise regulate and/or control a plurality of such components, as well as regulating and/or controlling actuators for orienting and/or pointing one or more reflectors 94 and/or one or more absorbers/sinks 96, for example, to modulate and/or otherwise establish one or more corresponding longitudinal mechanical waves with selected frequencies and/or amplitudes and/or directions, thereby achieving and/or modulating a desired wave pattern, wave interference or otherwise, for example, to effectively and/or efficiently deflect or otherwise inhibit debris and/or particles from reaching the mask or reticle 618.

In some embodiments, the controller 210 may be implemented via hardware, software, firmware or a combination thereof. In particular, one or more controllers may be embodied by processors, electrical circuits, computers and/or other electronic data processing devices that are configured and/or otherwise provisioned to perform one or more of the tasks, steps, processes, methods and/or functions described herein. For example, a processor, computer, server or other electronic data processing device embodying a controller may be provided, supplied and/or programmed with a suitable listing of code (e.g., such as source code, interpretive code, object code, directly executable code, and so forth) or other like instructions or software or firmware, such that when run and/or executed by the computer or other electronic data processing device one or more of the tasks, steps, processes, methods and/or functions described herein are completed or otherwise performed. Suitably, the listing of code or other like instructions or software or firmware is implemented as and/or recorded, stored, contained or included in and/or on a non-transitory computer and/or machine readable storage medium or media so as to be providable to and/or executable by the computer or other electronic data processing device. For example, suitable storage mediums and/or media can include but are not limited to: floppy disks, flexible disks, hard disks, magnetic tape, or any other magnetic storage medium or media, CD-ROM, DVD, optical disks, or any other optical medium or media, a RAM, a ROM, a PROM, an EPROM, a FLASH-EPROM, or other memory or chip or cartridge, or any other tangible medium or media from which a computer or machine or electronic data processing device can read and use. In essence, as used herein, non-transitory computer-readable and/or machine-readable mediums and/or media comprise all computer-readable and/or machine-readable mediums and/or media except for a transitory, propagating signal.

In general, any one or more of the particular tasks, steps, processes, methods, functions, elements and/or components described herein may be implemented on and/or embodiment in one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. In general, any device, capable of implementing a finite state machine that is in turn capable of implementing the respective tasks, steps, processes, methods and/or functions described herein can be used.

Figure 14:
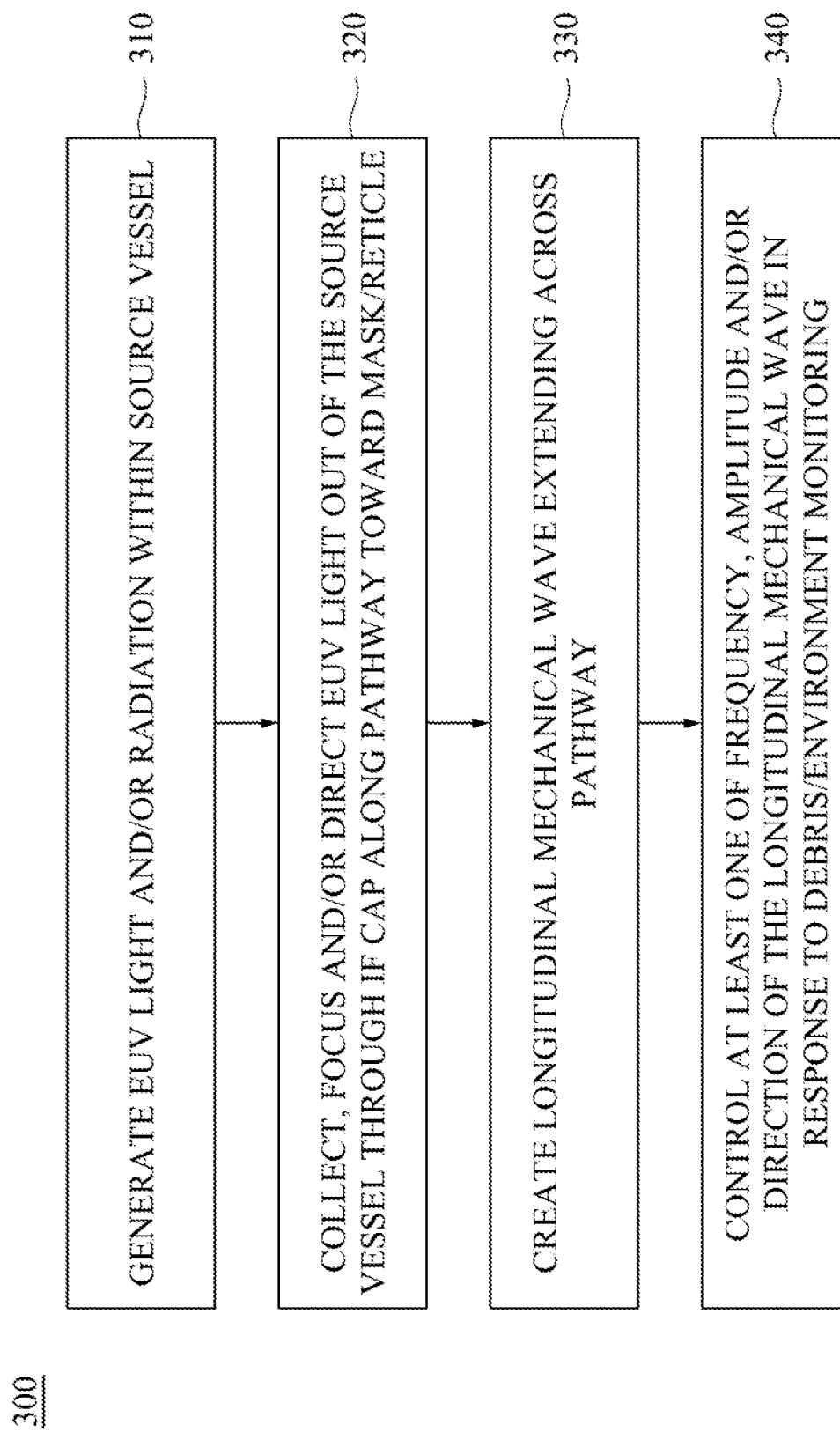

FIG. 14 shows a flow chart illustrating an exemplary lithography method or process 300 in accordance with aspects of some suitable embodiments disclosed herein.

As shown in FIG. 14, the method 300 begins at step 310 wherein EUV light is generated within a source vessel 12. Suitably, the EUV light or radiation is emitted from a plasma created by striking a stream of droplets 70 of target material (for example, such as Sn) with pulses 80 from one or more lasers.

In some suitable embodiments, at step 320, the generated EUV light is collected, focused and/or directed (for example, at least in part by the collector 32) out of the source vessel 12 through an IF cap 20 along a pathway toward the mask or reticle 618 of the scanner 613.

In some suitable embodiments, at step 330, one or more longitudinal mechanical waves 90 are created, which extend across the pathway 100. For example, as shown in the embodiments of FIGS. 4-12, one or more wave generators 92, one or more reflectors 94 and/or one or more absorbers/sinks 96, for example, under the control of the controller 210, may be employed to selectively generate, modulate and/or otherwise manipulate the one or more longitudinal mechanical waves 90.

In some suitable embodiments, at step 340, the frequency, amplitude and/or direction of each of the one or more longitudinal mechanical waves may be selectively established or otherwise set and/or selectively varied, modified and/or altered. For example, the controller 210 may receive feedback and/or input from one or more cameras, sensors, detectors and/or other suitable metrology devices 220 that monitor debris or particles (for example, produced from the target material when struck the laser pulses), the trajectories of such debris or particles, and/or environmental conditions, within the vessel 12; and based on such feedback and/or input, the controller 210 may suitably regulate or otherwise control one or more of the wave generators 92 and/or their corresponding power supply 202, and/or one or more actuators 98 (which, for example, selectively adjust an orientation of a coupled wave generator 92, reflector 94 and/or absorber/sink 96), in order to establish and/or selective alter the frequency, amplitude and/or direction of the one or more longitudinal mechanical waves 90.

In the following, some further illustrative embodiments are described.

In some embodiments, a method of extreme ultraviolet lithography includes: generating within a source vessel extreme ultraviolet (EUV) light by striking a stream of droplets of target material shot across the source vessel with pulses from a laser to create a plasma from which EUV light is emitted; directing the generated EUV light out of the source vessel through an intermediate focus cap along a pathway toward a reticle of a scanner; creating an acoustic wave extending across the pathway; and exposing a photoresist layer on a semiconductor substrate to pattern a circuit layout by the generated EUV light.

In some further embodiments, the acoustic wave deflects debris particles traveling along the pathway away from a trajectory that results in the particles striking the reticle.

In still additional embodiments, the acoustic wave is one of a supersonic wave, a subsonic wave, an ultrasonic wave and an infrasonic wave.

In some embodiments, the acoustic wave is a standing wave.

In yet further embodiments, the acoustic wave is created by driving a transducer positioned on a first side of the pathway to project the acoustic wave across the pathway.

In some further embodiments, the method further includes reflecting the projected acoustic wave from a reflector positioned on a second side of the pathway back across the pathway, the second side being opposite the first side.

In some embodiments, the method further includes absorbing at least a portion of the projected acoustic wave with a sink upon which the projected longitudinal wave impinges, said sink being positioned on a second side of the pathway opposite the first side of the pathway.

In yet further embodiments, the method further includes creating a further acoustic wave across the pathway by driving a further transducer positioned on a second side of the pathway to project the further acoustic wave across the pathway, said second side of the pathway being opposite the first side of the pathway.

In some embodiments, the transducer and the further transducer face one another such that the acoustic wave and the further acoustic wave are projected to cross one another in opposing directions.

In some further embodiments, at least one of a frequency, an amplitude and a direction of the acoustic wave are varied over time in response to one or more measurements of debris particles within the source vessel In still further embodiments, a method is provided for deflecting particles in an extreme ultraviolet (EUV) lithography system used to expose a photoresist coated on a semiconductor substrate to a pattern of EUV light. The method includes: establishing a longitudinal mechanical wave extending across a pathway followed by EUV light generated in a source vessel, the pathway leading to a mask of an EUV scanner, the mask defining the pattern of EUV light to which the photoresist is exposed; monitoring particles within the source vessel; and tuning at least one of a frequency and amplitude of the longitudinal mechanical wave in response to said monitoring. Suitably, the longitudinal mechanical wave acts on the particles to inhibit them from reaching the mask.

In yet additional embodiments, the method further includes adjusting a direction of the longitudinal mechanical wave in response to the monitoring.

In some further embodiments, the longitudinal mechanical wave is a standing wave.

In some additional embodiments, the longitudinal mechanical wave is generated by a wave generator comprising a speaker, an electroacoustic transducer, an electromechanical transducer, an ultrasonic transducer or a vibrating device.

In some embodiments, the method further includes reflecting the longitudinal mechanical wave back across the pathway.

In some embodiments, an extreme ultraviolet (EUV) lithography system includes: an EUV light source including an EUV vessel with an intermediate focus (IF) cap at one end of the EUV vessel, a droplet generator, and a laser, the EUV light source operative to generate EUV light within the EUV vessel by striking a target material emitted into the EUV vessel by the droplet generator with pulses from the laser to produce a plasma from which the EUV light is emitted, the EUV light exiting the EUV vessel along a pathway through the IF cap and wherein striking the target material with pulses from the laser creates debris from the target material; and an acoustic wave generator that generates an acoustic wave that extends across said pathway, the acoustic wave deflecting debris on a trajectory along said pathway headed toward a reticle of an EUV scanner receiving the EUV light, the deflecting causing the debris not to reach the reticle.

In some further embodiments, the acoustic wave generator is disposed with the IF cap of the EUV light source.

In still further embodiments, the acoustic wave generator is situated alongside the pathway beyond the IF cap of the EUV light source.

In yet further embodiments, the system further includes a dynamic gas lock that produces a gas flow in a vicinity of the IF cap, the gas flow creating a drag on particles traveling through the IF cap; and wherein the acoustic wave lengthens a residence time of particles within the IF cap such that the drag is experienced for a longer time.

In still one more embodiment, the system further includes an acoustic reflector situated across the pathway from the acoustic wave generator, the acoustic reflector arranged to reflect the acoustic wave.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of extreme ultraviolet lithography, said method comprising:
generating within a source vessel extreme ultraviolet (EUV) light by striking a stream of droplets of target material shot across the source vessel with pulses from a laser to create a plasma from which EUV light is emitted;
directing the generated EUV light out of the source vessel through an intermediate focus cap along a pathway toward a reticle of a scanner; and
creating an acoustic wave extending across the generated EUV light directed along the pathway.

2. The method of claim 1, wherein the acoustic wave deflects debris particles traveling along the pathway away from a trajectory that results in the particles striking the reticle.

3. The method of claim 1, wherein the acoustic wave is one of a supersonic wave, a subsonic wave, an ultrasonic wave and an infrasonic wave.

4. The method of claim 1, wherein the acoustic wave is a standing wave.

5. The method of claim 1, wherein said creating comprises:
driving a transducer positioned on a first side of the pathway to project the acoustic wave across the pathway.

6. The method of claim 5, further comprising:
reflecting the projected acoustic wave from a reflector positioned on a second side of the pathway back across the pathway, the second side being opposite the first side.

7. The method of claim 5, further comprising:
absorbing at least a portion of the projected acoustic wave with a sink upon which the projected acoustic wave impinges, said sink being positioned on a second side of the pathway opposite the first side of the pathway.

8. The method of claim 5, further comprising:
creating a further acoustic wave across the pathway by driving a further transducer positioned on a second side of the pathway to project the further acoustic wave across the pathway, said second side of the pathway being opposite the first side of the pathway.

9. The method of claim 8, wherein the transducer and the further transducer face one another such that the acoustic wave and the further acoustic wave are projected to cross one another in opposing directions.

10. The method of claim 1, wherein at least one of a frequency, an amplitude and a direction of the acoustic wave are varied over time in response to one or more measurements of debris particles within the source vessel.

11. A method of deflecting particles in an extreme ultraviolet (EUV) lithography system for exposing a photoresist coated on a semiconductor substrate to a pattern of EUV light, the method comprising:
establishing a longitudinal mechanical wave extending across a pathway followed by EUV light generated in a source vessel, said pathway leading to a mask of an EUV scanner;
monitoring particles within the source vessel; and
tuning at least one of a frequency and amplitude of said longitudinal mechanical wave in response to said monitoring;
wherein said longitudinal mechanical wave acts on said particles to inhibit them from reaching the mask.

12. The method of claim 11, said method further comprising:
adjusting a direction of the longitudinal mechanical wave in response to the monitoring.

13. The method of claim 11, wherein the longitudinal mechanical wave is a standing wave.

14. The method of claim 11, wherein the longitudinal mechanical wave is generated by a wave generator comprising a speaker, an electroacoustic transducer, an electromechanical transducer, an ultrasonic transducer or a vibrating device.

15. The method of claim 11, further comprising:
reflecting the longitudinal mechanical wave back across the pathway.

16. An extreme ultraviolet (EUV) lithography system comprising:
a source vessel including an intermediate focus (IF) cap at one of the source vessel, a droplet generator, and a laser, wherein an EUV light is generated by striking a stream of droplets from the droplet generator by the laser to create a plasma from which EUV light is emitted, and wherein the generated EUV light is directed out of the source vessel through the intermediate focus cap along a pathway toward a reticle of a scanner; and
an acoustic generator operative to create an acoustic wave extending across the generated EUV light directed along the pathway.

17. The lithography system of claim 16, wherein striking the stream of droplets creates debris from the droplets, and wherein the acoustic wave deflects debris traveling along the pathway away from a trajectory that results in the debris striking the reticle.

18. The lithography system of claim 17, wherein the acoustic wave generator is disposed with the IF cap of the EUV light source.

19. The lithography system of claim 16, wherein the acoustic wave generator is situated alongside the pathway beyond the IF cap of the EUV light source.

20. The lithography system of claim 16, further comprising an acoustic reflector situated across the pathway from the acoustic wave generator, said acoustic reflector arranged to reflect the acoustic wave.

* * * * *